(12) United States Patent
Lee et al.

(10) Patent No.: US 9,817,043 B2
(45) Date of Patent: Nov. 14, 2017

(54) CASSETTE MOUNTING DETECTION APPARATUS AND METHOD FOR DETECTING MOUNTING OF A CASSETTE

(71) Applicant: LG CNS Co., Ltd., Seoul (KR)

(72) Inventors: Hyo Wook Lee, Seoul (KR); Young Sik Bang, Seoul (KR)

(73) Assignee: LG CNS CO., LTD., Seoul (KR)

( * ) Notice: Subject to any disclaimer, the term of this patent is extended or adjusted under 35 U.S.C. 154(b) by 137 days.

(21) Appl. No.: 14/619,789

(22) Filed: Feb. 11, 2015

(65) Prior Publication Data
US 2015/0226773 A1   Aug. 13, 2015

(30) Foreign Application Priority Data
Feb. 11, 2014   (KR) .......................... 10-2014-0015401

(51) Int. Cl.
*G01R 19/165*   (2006.01)
*G01V 3/00*   (2006.01)

(52) U.S. Cl.
CPC ........... *G01R 19/1659* (2013.01); *G01V 3/00* (2013.01)

(58) Field of Classification Search
CPC .............................. G01R 19/1659; G01V 3/00
USPC ........................................................ 324/704
See application file for complete search history.

(56) References Cited

U.S. PATENT DOCUMENTS

| | | | |
|---|---|---|---|
| 5,333,852 A | 8/1994 | Mililo et al. | |
| 7,397,576 B2 * | 7/2008 | Hong | ........................ B65H 3/44 358/1.15 |
| 2003/0098540 A1 * | 5/2003 | Hong | ........................ B65H 3/44 271/9.01 |
| 2011/0103871 A1 | 5/2011 | Van Coppenolle et al. | |
| 2011/0133943 A1 | 6/2011 | Kouyama et al. | |
| 2013/0093442 A1 | 4/2013 | Lee | |
| 2014/0340463 A1 | 11/2014 | Van Coppenolle et al. | |
| 2016/0250873 A1 | 9/2016 | Van Coppenolle et al. | |

FOREIGN PATENT DOCUMENTS

| | | |
|---|---|---|
| CN | 1117009 A | 2/1996 |
| CN | 102076503 A | 5/2011 |
| CN | 102185191 A | 9/2011 |
| KR | 10-2010-0060969 A | 6/2010 |
| KR | 10-2011-0012911 A | 2/2011 |
| KR | 10-2012-0078770 A | 7/2012 |
| KR | 10-2013-0041614 A | 4/2013 |

OTHER PUBLICATIONS

Office Action dated Dec. 29, 2016 in Chinese Application No. 201510073549.8.

* cited by examiner

*Primary Examiner* — Billy Lactaoen
(74) *Attorney, Agent, or Firm* — Saliwanchik, Lloyd & Eisenschenk

(57) ABSTRACT

A cassette mounting detection apparatus may include a cassette mounting unit configured to include a plurality of slots on which a plurality of cassettes is mounted and the mounting detection circuits of the respective slots and a main control unit configured to include a plurality of signal output terminals and a plurality of voltage detection terminals and to detect that at least one of the plurality of cassettes is mounted on any of the plurality of slots based on an output signal output through at least one of the plurality of signal output terminals and cassette voltages detected through at least one of the plurality of voltage detection terminals.

18 Claims, 7 Drawing Sheets

CASSETTE MOUNTING DETECTION APPARATUS AND METHOD FOR DETECTING MOUNTING OF A CASSETTE

CROSS-REFERENCE TO RELATED APPLICATION

This application claims priority under 35 U.S.C. §119(a) to Korean Application No. 10-2014-0015401, filed Feb. 11, 2014, which is incorporated hereby by reference in its entirety.

BACKGROUND

Technical Field

The present disclosure relates to an apparatus and method for detecting the mounting of a cassette.

Related Art

An apparatus for inserting or withdrawing a medium, such as a financial apparatus, may include cassettes in which media to be inserted or withdrawn may be kept. A plurality of cassettes may be mounted on the apparatus in order to keep different types of media having different sizes or thicknesses separate. The apparatus may include a cassette mounting detection apparatus to detect the mounting of a cassette. The cassette mounting detection apparatus detects a slot on which a cassette has been mounted among a plurality of slots. Accordingly, in order to connect a main control unit for detecting a slot on which a cassette has been mounted and a cassette mounting unit on which a cassette is mounted, a larger number of signal lines or cables need to be connected as the number of mounted cassettes increases. Furthermore, the connection structure of the cables and the configuration of the cassette mounting unit become complicated.

BRIEF SUMMARY

Various embodiments are directed to the provision of an apparatus and method for detecting the mounting of a cassette, which are capable of effectively detecting the mounting of a cassette although the number of slots is increased. A technical object of the apparatus and method for detecting the mounting of a cassette is not limited to the aforementioned object and may include other technical objects.

In an embodiment, a cassette detection apparatus may include a cassette mounting unit configured to include a plurality of slots on which a plurality of cassettes is mounted and the mounting detection circuits of the respective slots and a main control unit configured to include a plurality of signal output terminals and a plurality of voltage detection terminals and to detect that at least one of the plurality of cassettes is mounted on any of the plurality of slots based on an output signal output through at least one of the plurality of signal output terminals and cassette voltages detected through at least one of the plurality of voltage detection terminals.

In an embodiment, a cassette mounting detection apparatus may include a plurality of cassettes, a cassette mounting unit configured to include a plurality of slots on which the plurality of cassettes is mounted, and a main control unit configured to detect that at least one of the plurality of cassettes is mounted on any of the plurality of slots, wherein the main control unit and the cassette mounting unit may be connected by signal lines having a number smaller than the plurality of cassettes.

In an embodiment, a method for detecting the mounting of a cassette may include generating an output signal, outputting an output signal to at least one slot on which a cassette has been mounted through at least one signal output terminal, detecting a cassette voltage of a voltage detection terminal connected to the at least one slot through a cable, comparing the detected cassette voltage with a preset cassette voltage, and detecting a slot on which a cassette has been mounted of among a plurality of slots based on a result of the comparison.

In an embodiment, there may be provided a computer-readable recording medium on which a program for executing the method for detecting the mounting of a cassette has been recorded.

DETAILED DESCRIPTION

Figure 1:
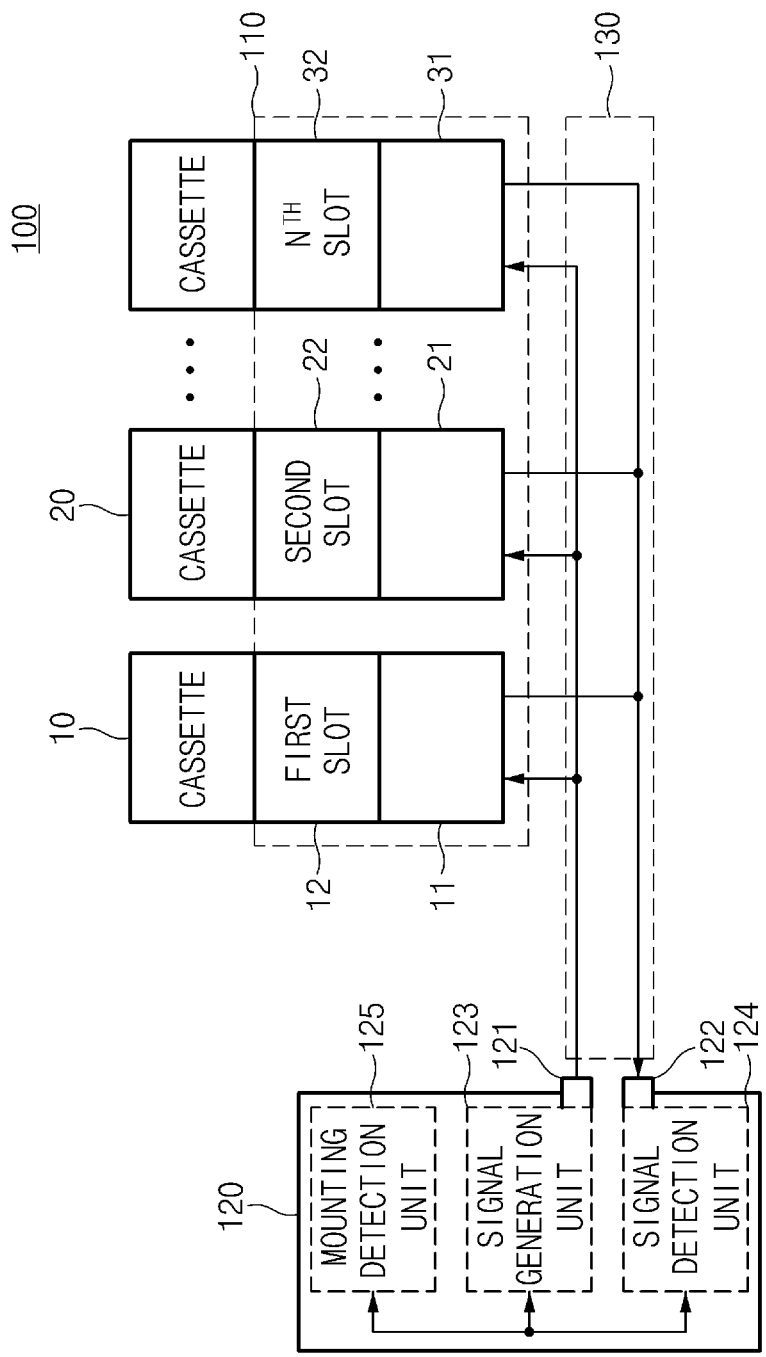
FIG. 1 is a block diagram of a cassette mounting detection apparatus in accordance with an embodiment of the present invention.

Hereinafter, an apparatus and method for detecting the mounting of a cassette will be described in detail with reference to the accompanying drawings through various examples of embodiments.

Hereinafter, some embodiments of the present invention are described in detail with reference to exemplary drawings. It is to be noted that in assigning reference numerals to elements in the drawings, the same reference numerals denote the same elements throughout the drawings even in cases where the elements are shown in different drawings. Furthermore, in describing the embodiments of the present invention, a detailed description of the known functions and constitutions will be omitted if it is deemed to make the gist of the present invention unnecessarily vague.

Furthermore, in describing the elements of this specification, terms, such as the first, the second, A, B, (a), and (b), may be used. However, although the terms are used only to distinguish one element from the other element, the essence, order, or sequence of the elements is not limited by the terms. When it is said that one element is "connected", "combined", or "coupled" with the other element, the one element may be directly connected or coupled with the other element, but it should also be understood that a third element may be "connected", "combined", or "coupled" between the two elements.

In this specification, a "medium" may be defined as a concept that includes all of bills, securities, electronic billing systems, coins, and gift cards, for example. A financial apparatus in accordance with an embodiment of the present invention may be, for example, an apparatus for performing financial tasks for receiving various media, such as bills, securities, electronic billing systems, coins, and gift cards, and performing medium processing, for example, deposit processing, processing such as payment through electronic billing systems, and the exchange of gift cards, and/or withdrawal processing, processing such as the discharge of electronic billing systems, and the discharge of gift cards. For example, the financial apparatus may include an automated teller machine (ATM), such as a cash dispenser (CD) or a cash recycling device. However, the financial apparatus is not limited to the aforementioned examples and may include an apparatus for automating financial tasks, such as a financial information system (FIS).

Embodiments of the present invention are described below assuming that a financial apparatus is a financial automation device. It is to be noted that the assumption is only for convenience of description and the technical feature of the present invention is not limited to a financial automation device.

FIG. 1 is a block diagram of a cassette mounting detection apparatus in accordance with an embodiment of the present invention. Referring to FIG. 1, the cassette mounting detection apparatus 100 may include a cassette 10, a cassette mounting unit 110, and a main control unit 120. The cassette mounting detection apparatus 100 may further include a cable 130.

In this specification, only elements related to the present embodiment are described in order to prevent the characteristics of the present embodiment from being obscure. Accordingly, those skilled in the art to which the present embodiment pertains will understand that other general-purpose elements may be further included in addition to the elements illustrated in FIG. 1.

The cassette mounting detection apparatus 100 may detect the mounting of a cassette. The cassette mounting detection apparatus 100 detects a slot on which a cassette has been mounted of among a plurality of slots. For example, the cassette mounting detection apparatus 100 may include a cash dispenser (CD), a cash recycling device, or an automated teller machine (ATM) on which a cassette for keeping media to be inserted or withdrawn is mounted. However, the cassette mounting detection apparatus 100 is not limited to the examples, and it may include all the apparatuses for detecting whether a cassette has been mounted.

The cassette 10 keeps media. The media may include bills, securities, electronic billing systems, coins, and gift cards. The cassette 10 may be attached to or detached from the slot of the cassette mounting unit 110. The cassette mounting unit 110 includes a plurality of slots 12, 22, . . . . Accordingly, a plurality of cassettes 10, 20, . . . may be mounted on the cassette mounting unit 110. The plurality of cassettes 10, 20, . . . may keep media having different sizes or thicknesses. For example, the plurality of cassettes 10, 20, . . . may keep respective bills, such as 1,000-won bills, 5,000-won bills, 10,000-won bills, 50,000-won bills, and 100,000-won checks. Alternatively, different cassettes may keep one kind of bills.

The cassette mounting unit 110 may be implemented on a tray board. The cassette mounting unit 110 may include a first cassette mounting unit to an $N^{th}$ cassette mounting unit respectively on which a cassette may be mounted. The first cassette mounting unit may include a first mounting detection circuit 11 and/or a first slot 12. Likewise, the $N^{th}$ cassette mounting unit may include an $N^{th}$ mounting detection circuit 31 and/or an $N^{th}$ slot 32. For convenience of description, the first cassette mounting unit is described as an example.

When the cassette 10 is mounted on the first slot 12 of the first cassette mounting unit, a cassette voltage is output to the first cassette mounting unit in response to an output signal received from the main control unit 120. The cassette voltage may correspond to a voltage which is detected by the cassette 10 or a voltage detection terminal 122 when the cassette 10 has been mounted on a slot. The cassette 10 may detect the cassette voltage of the first slot 12 on which the cassette 10 has been mounted. Here, the cassette voltage of each slot has a different voltage level. Accordingly, the cassette 10 may check a slot on which it has been mounted among of the plurality of slots 12, 22, . . . of the cassette mounting unit 110 based on a detected cassette voltage. The main control unit 120 may detect a cassette voltage output by the cassette mounting unit 110 and check a slot on which a cassette has been mounted of among the plurality of slots 12, 22, . . . .

The mounting detection circuit of each slot may use in common any one of a signal output terminal 121 and a voltage detection terminal 122 along with the mounting detection circuits of other slots. In other words, the mounting detection circuit of at least one slot may be connected to a single signal output terminal 121, and the mounting detection circuit of at least one slot may be connected to a single voltage detection terminal 122. Here, the mounting detection circuits of a plurality of slots connected to the same signal output terminal 121 are connected to different voltage detection terminals 122. This is described in detail with reference to FIG. 3.

A maximum number of the mounting detection circuits of slots that may be connected to the single signal output terminal 121 are the same as the number of voltage detection terminals 122. For example, if the number of voltage detection terminals is "n," a maximum "n" number of the mounting detection circuits of slots may be connected to the single signal output terminal 121.

The first mounting detection circuit 11 may include an internal resistor and a diode. When the cassette 10 is mounted on the first slot 12, the main control unit 120 outputs an output signal to the first cassette mounting unit. The output signal flows into the internal resistor and diode of the first mounting detection circuit 11. The internal resistor may be a variable resistor. The diode is connected in series to the internal resistor, and it functions to prevent an output signal from flowing into the mounting detection circuit of another slot. This is described in detail with reference to FIG. 3.

The main control unit 120 may generate an output signal and output the output signal to the cassette mounting unit 110 through the at least one signal output terminal 121. The main control unit 120 may detect a cassette voltage through the at least one voltage detection terminal 122 in response to the output signal. The main control unit 120 may detect a slot on which the cassette 10 has been mounted based on the detected cassette voltage.

For example, the number of signal output terminals 121 and the number of voltage detection terminals 122 of the main control unit 120 may be determined based on the number of cassettes which are able to be mounted on the cassette mounting detection apparatus 100.

The voltage detection terminal 122 of the main control unit 120 may be connected to a pull-down resistor. Here, the pull-down resistor may be located on any one of the main control unit 120 (for example, main board) and the cassette mounting unit 110 (for example, a tray board). The cassette voltage of each slot may be determined based on the resistance value of the pull-down resistor connected to the voltage detection terminal 122 to which the mounting detection circuit of each slot is connected and the resistance value of the internal resistor of the mounting detection circuit of a corresponding slot.

The resistance values of the pull-down resistor and the internal resistor may be determined so that a resistance ratio calculated for each slot has a different value. The resistance ratio is a ratio of the resistance value of a pull-down resistor to the sum of the resistance value of the pull-down resistor connected to the mounting detection circuit of each slot and the resistance value of the internal resistor of the mounting detection circuit of a corresponding slot. This is described in detail with reference to FIG. 3.

The main control unit 120 may further include a signal generation unit 123, a signal detection unit 124, and a mounting detection unit 125. The signal generation unit 123 may generate an output signal and output the output signal to the cassette mounting unit 110 through the at least one signal output terminal 121. The signal generation unit 123 may output one of a high signal and a low signal as the output signal depending on the signal output terminal 121.

The signal detection unit 124 detects a cassette voltage through the at least one voltage detection terminal 122. The mounting detection unit 125 identifies a slot on which the cassette 10 has been mounted based on a generated output signal and a detected cassette voltage.

In accordance with an embodiment, the signal generation unit 123 may generate an output signal of a high signal and output the output signal to the mounting detection circuit of a slot to be checked regarding whether the cassette 10 has been mounted on the slot. The signal detection unit 124 detects the cassette voltage of the slot to which an output signal has been output. The mounting detection unit 125 may check whether a cassette has been mounted on the slot based on the output signal and the detected cassette voltage. Accordingly, the mounting detection unit 125 determines whether the cassette voltage detected in the slot to which the output signal has been output corresponds to a GND reference voltage. If the cassette voltage is determined to correspond to the GND reference voltage, the mounting detection unit 125 determines that three is no cassette mounted on the slot. If the cassette voltage is determined to not correspond to the GND reference voltage, the mounting detection unit 125 determines that the cassette has been mounted on the slot.

In other embodiments, the signal generation unit 123 may generate an output signal and sequentially output the output signal of a high signal to a plurality of the signal output terminals. The signal detection unit 124 may sequentially detect cassette voltages through the voltage detection terminal 122. The mounting detection unit 125 may detect a slot on which the cassette 10 has been mounted based on the output signal and the sequentially detected cassette voltages. The mounting detection unit 125 may compare each detected cassette voltage with a cassette voltage corresponding to each slot and determine a slot on which the cassette 10 has been mounted.

The main control unit 120 may further include a storage unit (not illustrated) for storing cassette voltages corresponding to respective slots. The mounting detection unit 125 may compare a cassette voltage, detected in response to an output signal, with cassette voltages stored in the storage unit (not illustrated) and determine a slot on which the cassette 10 has been mounted based on a result of the comparison. Alternatively, if the cassette voltage is a specific value or less, the mounting detection unit 125 may determine that the cassette 10 has not been mounted on a corresponding slot. The specific value may be smaller than the cassette voltage of each of all the slots. For example, the specific value may be a GND reference voltage.

The main control unit 120 according to the present embodiment may correspond to at least one processor or include at least one processor. Accordingly, the cassette mounting detection apparatus 100 may be driven in such a way as to be included in other hardware device, such as a microprocessor or a general-purpose computer system.

The cable 130 connects the cassette mounting unit 110 and the main control unit 120. The number of cables 130 may be increased depending on the number of connected cassettes. In the cassette mounting detection apparatus 100 in accordance with various embodiments of the present invention, the number of cables 130 that connect the cassette mounting unit 110 and the main control unit 120 can be reduced by sharing any one of a cable for receiving an output signal generated by the main control unit 120 and a cable for outputting a signal to the main control unit 120 with other slots.

For example, if the main control unit 120 includes m signal output terminals and n voltage detection terminals, the cassette mounting detection apparatus 100 may detect a maximum (m*n) number of cassettes using (m+n) cables. Here, m and n are natural numbers. Accordingly, the main control unit 120 and the cassette mounting unit 110 may be connected by a smaller number of signal lines.

In accordance with an embodiment, the cable 130 may include a plurality of signal lines. The number of signal lines is increased depending on the number of connected cassettes. In the cassette mounting detection apparatus 100, the number of signal lines that connect the cassette mounting unit 110 and the main control unit 120 can be reduced by using in common any one of a signal line for receiving an output signal generated by the main control unit 120 and a signal line for outputting a signal to the main control unit 120 with other slots.

For example, if the main control unit 120 includes m signal output terminals and n voltage detection terminals, the cassette mounting detection apparatus 100 may detect a maximum (m*n) number of cassettes using (m+n) signal lines. Here, m and n are natural numbers. Accordingly, the main control unit 120 and the cassette mounting unit 110 may be connected by a smaller number of signal lines.

Figure 2:
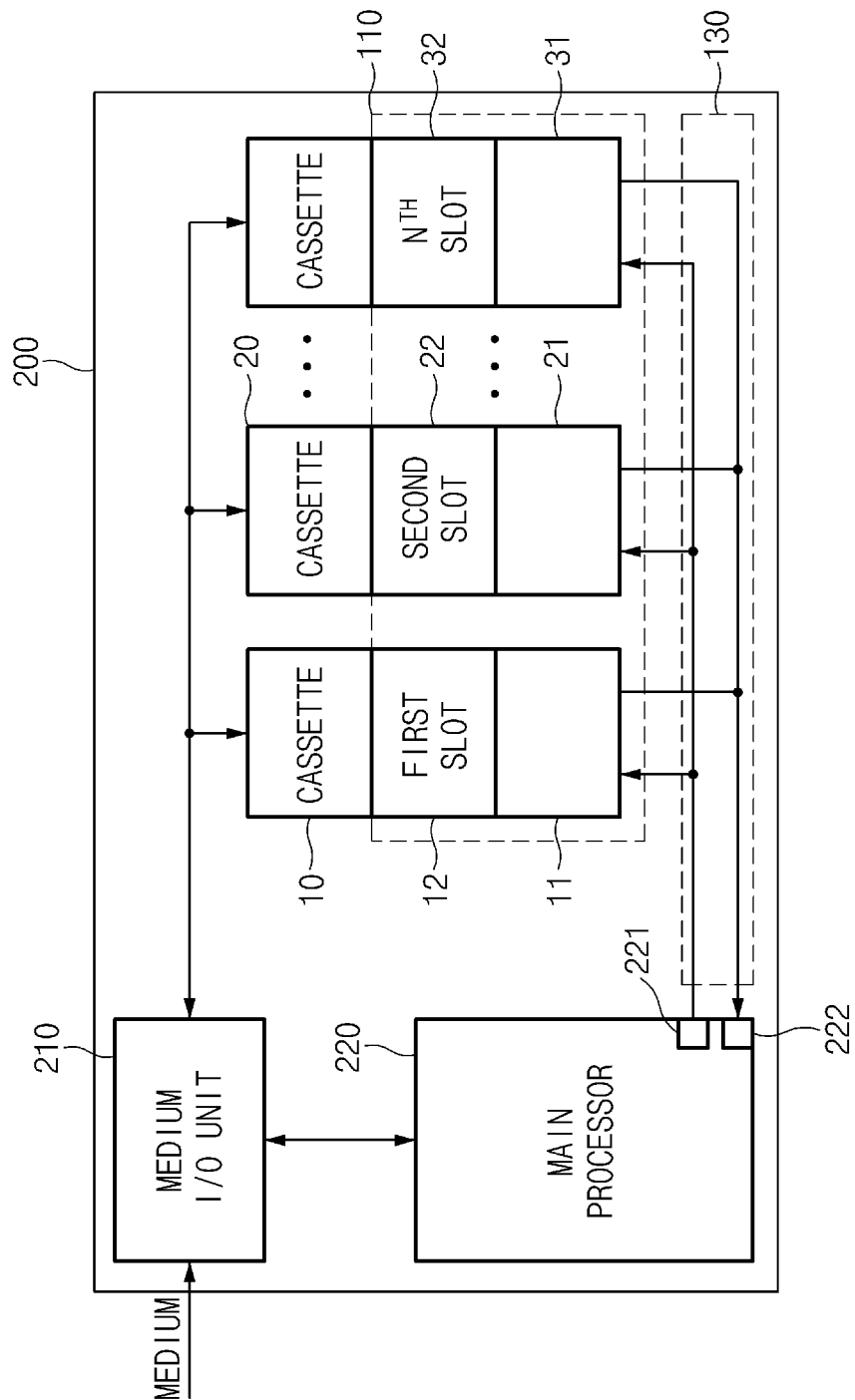
FIG. 2 is a block diagram of a financial apparatus in accordance with an embodiment of the present invention.

FIG. 2 is a block diagram of a financial apparatus in accordance with an embodiment of the present invention.

Referring to FIG. 2, the financial apparatus 200 may include the cassettes 10, 20, . . . , the cassette mounting unit 110, the cable 130, a medium input/output (I/O) unit 210, and a main processor 220. The main processor 220 of FIG. 2 includes the main control unit 120 of FIG. 1. The contents described in connection with the cassettes 10, 20, . . . , the cassette mounting unit 110, the cable 130, and the main control unit 120 with reference to FIG. 1 may be applied to the cassettes 10, 20, . . . , the cassette mounting unit 110, the cable 130, the medium I/O unit 210, and the main processor 220 of FIG. 2. Accordingly, contents that overlap with those of FIG. 1 are omitted.

The financial apparatus 200 of FIG. 2 detects a slot on which a cassette has been mounted of among a plurality of slots and processes the insertion or withdrawal of a corresponding medium.

The cassette 10 keeps media inserted from the medium I/O unit 210 or media to be withdrawn to the medium I/O unit 210. The cassette 10 may be attached to or detached from a slot of the cassette mounting unit 110. The cassette mounting unit 110 is equipped with a plurality of slots 12, 22, . . . , and the plurality of cassettes 10, 20, . . . may be mounted on the cassette mounting unit 110.

The plurality of cassettes 10, 20, . . . may be mounted on the cassette mounting unit 110. The cassette mounting unit 110 may include a first cassette mounting unit to an $N^{th}$ cassette mounting unit. The first cassette mounting unit may include the first mounting detection circuit 11 and/or the first slot 12. Likewise, the $N^{th}$ cassette mounting unit may include an $N^{th}$ mounting detection circuit 31 and/or an $N^{th}$ slot 32.

When the cassette 10 is mounted on a slot, a cassette voltage is output to the slot in response to an output signal from the main control unit 120. The cassette 10 may detect the cassette voltage of the slot on which the cassette 10 has been mounted and may check that it has been mounted on which one of the plurality of slots 12, 22, . . . of the cassette mounting unit 110 based on the detected cassette voltage.

Here, a type of medium to be inserted and withdrawn may be designated to each slot of the plurality of slots 12, 22, . . . . Also, the cassette 10 may store information on the type of medium which can be inserted or withdrawn to the cassette 10. The information on the type of medium for insertion and withdrawal may be stored before the cassette 10 is mounted on the slot. If the cassette 10 is mounted on one of the plurality of slots, the cassette voltage is output to a corresponding slot by the output signal from the main control unit 120. The cassette 10 may detect on which slot it has been mounted of among a plurality of slots based on the output cassette voltage and store a type of medium designated to the detected slot as information on the type of medium to be inserted and withdrawn. Alternatively, if the type of medium stored on the cassette 10 is different from the type of medium designated to the slot, the cassette 10 may change the information on the type of medium stored to the cassette 10 into the type of medium designated to the slot.

Medium I/O unit 210 may let media to be inserted into or withdrawn from the medium I/O unit 210. For example, the media may be bills, checks, electronic billing systems, or gift cards, but are not limited thereto. The medium I/O unit 210 may include a sensor for determining whether a medium has been inserted or withdrawn.

The main processor 220 may output an output signal to the cassette mounting unit 110 through at least one signal output terminal 221 and detect a cassette voltage through at least one voltage detection terminal 222 in response to the output signal. The cassette mounting unit 110 detects a slot on which a cassette has been mounted based on the detected cassette voltage. Here, the main processor 220 may further include a storage unit (not illustrated) for storing cassette voltages corresponding to respective slots.

Furthermore, the main processor 220 may control the medium I/O unit 210 and the cassette mounting unit 110 and process the insertion or withdrawal of a medium.

The main processor 220 may generate an output signal and output the output signal to the cassette mounting unit 110 through the at least one signal output terminal 221. The main processor 220 may output one of a high signal and a low signal as the output signal depending on the signal output terminal 221. For example, after outputting a high signal to the signal output terminal 221 connected to a slot to be checked regarding whether the cassette 10 has been mounted on the slot, the main processor 220 may determine whether the cassette voltage of the signal output terminal 221 connected the slot corresponds to a GND reference voltage and determine whether the cassette 10 has been mounted on the slot. For example, if the cassette voltage of a slot is a specific value or less, the main processor 220 may determine that a cassette has not been mounted on a corresponding slot.

Figure 3:
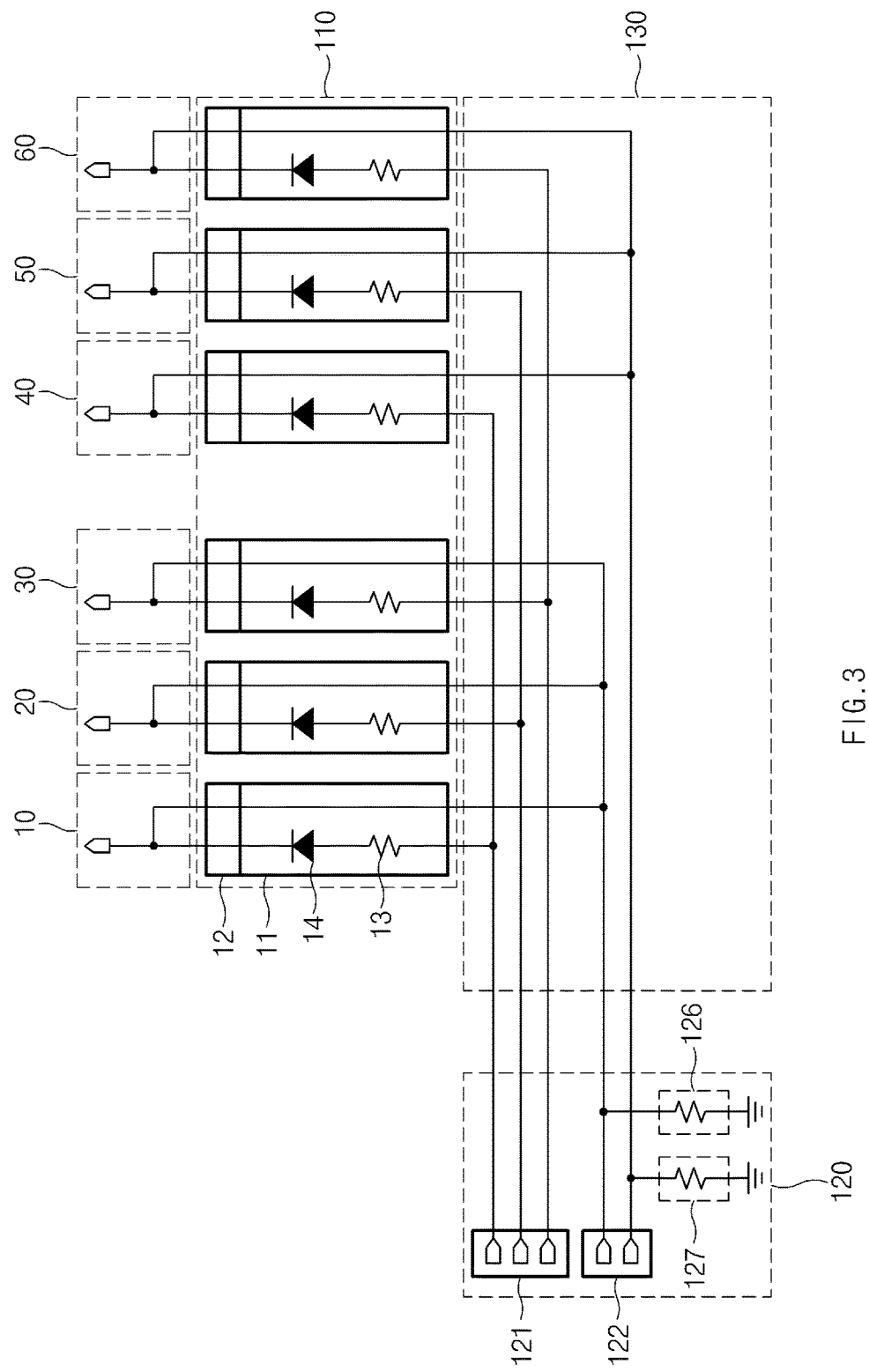
FIG. 3 is a circuit diagram of the cassette mounting detection apparatus in accordance with an embodiment of the present invention.

FIG. 3 is a circuit diagram of the cassette mounting detection apparatus in accordance with an embodiment of the present invention.

Referring to FIG. 3, the cassette mounting detection apparatus 100 may include the cassette 10, the cassette mounting unit 110, the main control unit 120, and the cable 130. The contents described in connection with the cassettes 10, 20, . . . , the cassette mounting unit 110, the cable 130, and the main control unit 120 with reference to FIGS. 1 and 2 may be applied to the cassettes 10, 20, . . . , the cassette mounting unit 110, the cable 130, the medium I/O unit 210, and the main control unit 120 of FIG. 3. Accordingly, contents that overlap with those of FIG. 1 are omitted.

The cassette mounting detection apparatus 100 according to the present embodiment may detect whether six cassettes 10, 20, 30, 40, 50, and 60 have been mounted.

The cassette mounting unit 110 may include a first cassette mounting unit to a sixth cassette mounting unit on which cassettes are to be mounted. The six cassettes 10, 20, 30, 40, 50, and 60 are mounted on the respective slots of the first cassette mounting unit to the sixth cassette mounting unit. Each of the cassette mounting units may include a mounting detection circuit and a slot. The first cassette mounting unit is described below as an example.

The first cassette mounting unit may include the first mounting detection circuit 11 and the first slot 12. The first mounting detection circuit 11 includes an internal resistor 13 and a diode 14 connected in series to the internal resistor 13. When an output signal is input to the first cassette mounting unit and the cassette 10 is mounted on the first slot 12, the circuits of the first mounting detection circuit 11 are connected by the cassette 10 mounted on the first slot 12. The input signal flows into the internal resistor 13 and diode 14 of the first mounting detection circuit 11. In response thereto, the cassette voltage of the first slot 12 is output. The cassette 10 may detect the cassette voltage of the first slot 12 and check whether it has been mounted on which slot based on the detected cassette voltage.

The main control unit 120 may generate an output signal, may output the output signal to the cassette mounting unit 110 through the at least one signal output terminal 121, and may detect a cassette voltage through the at least one voltage detection terminal 122 in response to the output signal. Referring to FIG. 3, the voltage detection terminal 122 of the main control unit 120 may be connected to pull-down resistors 126 and 127. The pull-down resistors 126 and 127 may be connected to between the voltage detection terminal 122 and a terminal for a GND reference voltage.

The mounting detection circuit of each slot may share any one of the signal output terminal 121 and the voltage detection terminal 122 with the mounting detection circuits of other slots. The cassette mounting detection apparatus 100 according to the present embodiment has been illustrated as including two voltage detection terminals 122 and three signal output terminals 121. The mounting detection circuits of two slots have been illustrated as being connected to a single signal output terminal 121. The mounting detection circuits of three slots have been illustrated as being connected to the single signal detection terminal 122.

The mounting detection circuits of a plurality of slots connected to the same signal output terminal 121 need to be connected to different voltage detection terminals 122. In the present embodiment, the mounting detection circuits of a maximum of two slots may be connected to the single signal output terminal 121 because the cassette mounting detection apparatus 100 includes the three signal output terminals 121.

The number of signal output terminals 121 and the number of voltage detection terminals 122 may be determined based on the number of mounting detection circuits of slots connected to the main control unit 120. The mounting detection circuits of a plurality of slots connected to the same signal output terminal 121 need to be connected to different voltage detection terminals 122. The number of signal output terminals 121 and the number of voltage detection terminals 122 are also increased as the number of mounting detection circuits of slots is increased. For example, if eight cassettes are mounted, the mounting detection circuit of each slot may be connected to four signal output terminals 121 and two voltage detection terminals 122.

Accordingly, the main control unit 120 may detect a slot on which the cassette 10 has been mounted in the cassette mounting unit 110 based on a cassette voltage detected on the signal output terminal 121 and the voltage detection terminal 122. Furthermore, each cassette may detect that it has been mounted on which one of a plurality of slots by detecting the cassette voltage of a slot mounted thereon.

Figure 4:
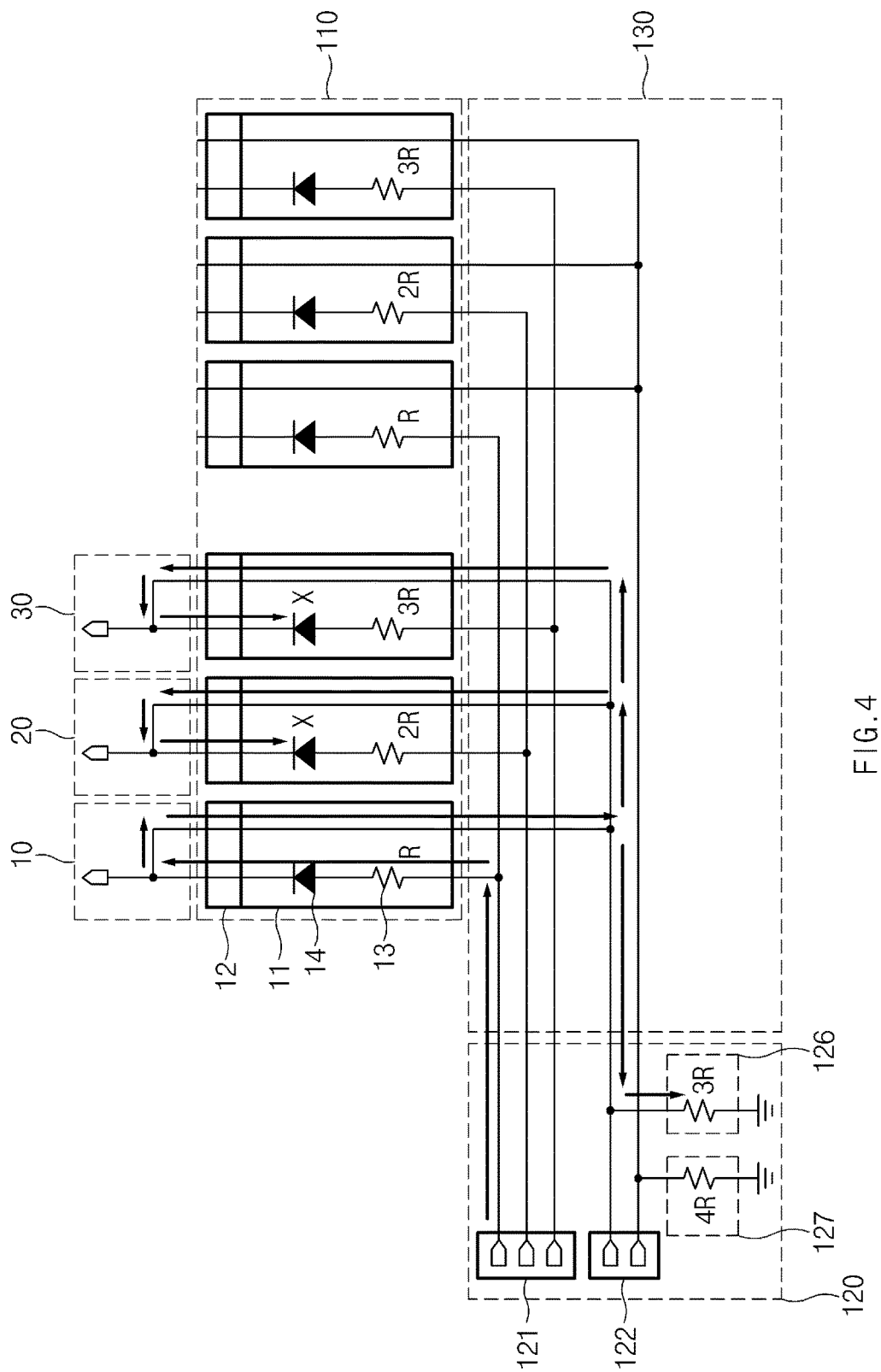
FIG. 4 is a diagram for configuring the operation of the cassette mounting detection apparatus in accordance with an embodiment of the present invention.

FIG. 4 is a diagram for configuring the operation of the cassette mounting detection apparatus in accordance with an embodiment of the present invention.

Referring to FIG. 4, the cassette mounting detection apparatus 100 may include the cassette 10, the cassette mounting unit 110, the main control unit 120, and the cable 130. The contents described in connection with the cassette 10, the cassette mounting unit 110, the cable 130, and the main control unit 120 with reference to FIGS. 1 to 3 may be applied to the cassette 10, the cassette mounting unit 110, the cable 130, the medium I/O unit 210, and the main control unit 120 of FIG. 4. Accordingly, contents that overlap with those of FIG. 1 are omitted.

The cassette mounting detection apparatus 100 according to the present embodiment may detect whether six cassettes 10, 20, 30, 40, 50, and 60 have been mounted. In FIG. 4, only three cassettes 10, 20, and 30 have been illustrated as being mounted.

When the cassette 10 is mounted on any one of the plurality of slots 12, 22, . . . of the cassette mounting unit 110, the main control unit 120 may generate and output an output signal. The cassette 10 may detect a cassette voltage, output from the cassette mounting unit 110, in response to the output signal of the main control unit 120 and check that it has been mounted on which one of the plurality of slots 12, 22, . . . based on the detected cassette voltage.

The main control unit 120 may output the output signal to the cassette mounting unit 110 through at least one signal output terminal 121 and detect the cassette voltage through the at least one voltage detection terminal 122 in response to the output signal. The main control unit 120 may detect a slot on which the cassette 10 has been mounted in the cassette mounting unit 110 based on the detected cassette voltage.

In the present embodiment, the first mounting detection circuit 11 to the $N^{th}$ mounting detection circuit 31 include internal resistors having pieces of respective internal resistance of 2R, 3R, R, 2R, and 3R. The main control unit 120 includes the pull-down resistors 126 and 127 having 3R and 4R. The cassette voltage of each slot is determined based on the resistance value of the pull-down resistor of the voltage detection terminal 122 connected to the mounting detection circuit of a corresponding slot, the resistance value of the internal resistor of the mounting detection circuit and a voltage drop of the diode. Accordingly, pieces of cassette voltage $V_{cst1}$ to $V_{cst6}$ of respective slots may be expressed as follows.

$$V_{cst1} = \frac{3}{4}*(V_H - V_D) \qquad \text{[Equation 1]}$$

$$V_{cst2} = \frac{3}{5}*(V_H - V_D) \qquad \text{[Equation 2]}$$

$$V_{cst3} = \frac{1}{2}*(V_H - V_D) \qquad \text{[Equation 3]}$$

$$V_{cst4} = \frac{4}{5}*(V_H - V_D) \qquad \text{[Equation 4]}$$

$$V_{cst5} = \frac{2}{3}*(V_H - V_D) \qquad \text{[Equation 5]}$$

$$V_{cst6} = \frac{4}{7}*(V_H - V_D) \qquad \text{[Equation 6]}$$

In the equations, $V_H$ denotes the voltage value of a high signal of a check signal, and $V_D$ denotes a voltage drop attributable to the diode. The present invention is not limited to the present embodiment, and the resistance values of the pull-down resistor and the internal resistor may be determined to be various values in which a resistance ratio is different. The resistance ratio is a ratio of the resistance value of a pull-down resistor to the sum of the resistance value of the pull-down resistor connected to the mounting detection circuit of each slot and the resistance value of the internal resistor of the mounting detection circuit of a corresponding slot.

The main control unit 120 may output an output signal to the cassette mounting unit 110 through the at least one signal output terminal 121. Here, as illustrated in FIG. 4, the diode 14 functions to prevent the output signal from flowing into the mounting detection circuit of another slot.

Cassette voltages of the first to third slots on which the cassettes 10, 20, and 30 have been mounted, detected by the cassettes 10, 20, and 30 and the main control unit 120, are $V_{cst1}$, $V_{cst2}$, and $V_{cst3}$, respectively, and cassette voltages of fourth to sixth slots are output as 0 because a cassette has not been mounted on the fourth to sixth slots.

As described above, the cassette mounting detection apparatus 100 may output a signal for detecting a slot and detect a slot on which a cassette has been mounted based on a cassette voltage detected in response to the output signal. Accordingly, although the number of slots is increased, a slot on which a cassette has been mounted can be detected effectively using smaller number of signal lines. Furthermore, a cassette may detect that it has been mounted on which one of a plurality of slots based on the cassette voltage of a slot on which the cassette has been mounted.

Figure 5:
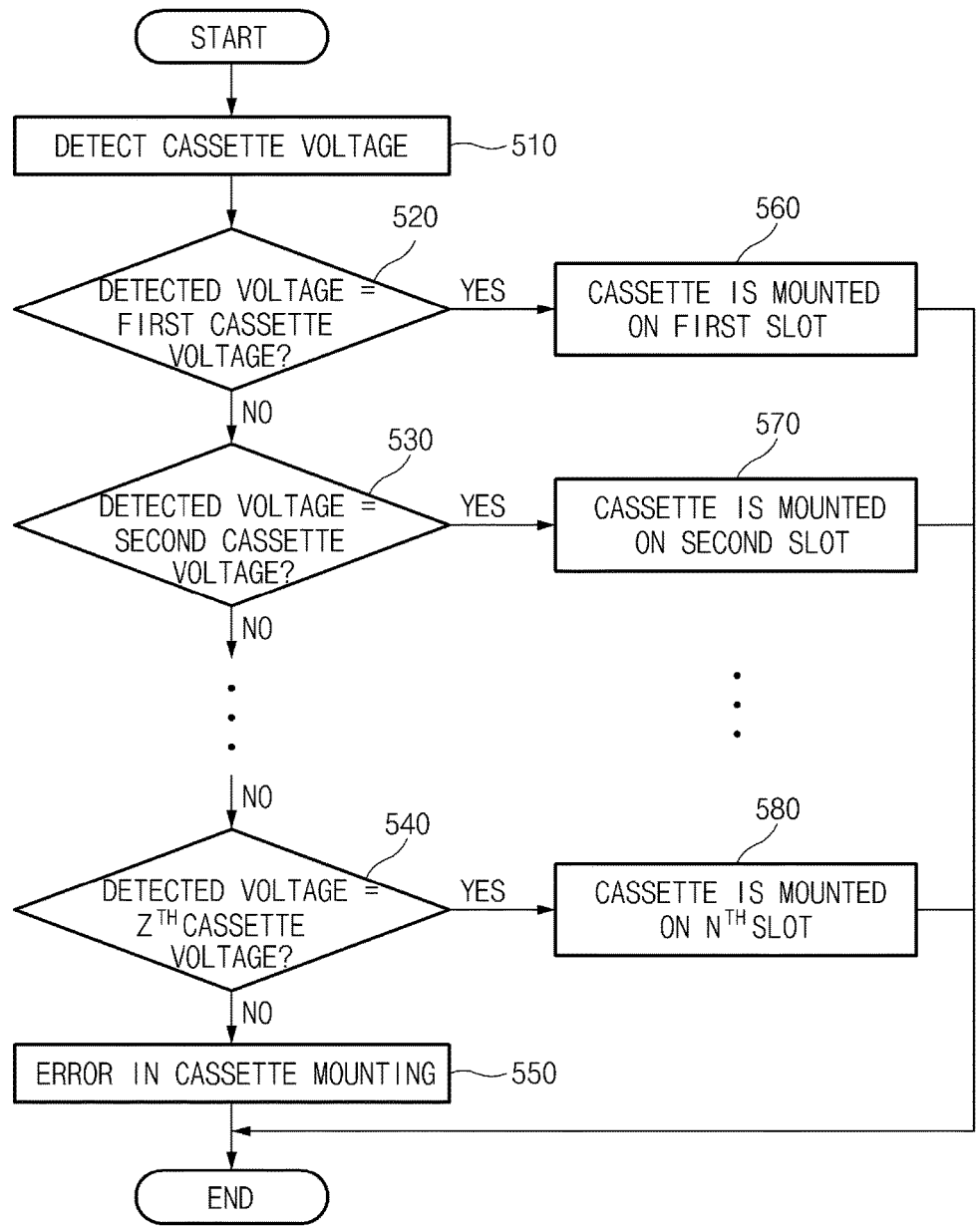
FIG. 5 is a flowchart illustrating a method of detecting, by a cassette, a slot on which the cassette has been mounted in accordance with an embodiment of the present invention.

FIG. 5 is a flowchart illustrating a method of detecting, by a cassette, a slot on which the cassette has been mounted in accordance with an embodiment of the present invention.

The flowchart illustrated in FIG. 5 includes steps that are processed by the cassette illustrated in FIGS. 1 to 4. It may be seen that although contents are omitted below, the contents described in connection with the cassette illustrated in FIGS. 1 to 4 may also be applied to the flowchart illustrated in FIG. 5.

At step 510, the cassette 10 detects a cassette voltage.

At step 520, the cassette 10 determines whether the detected cassette voltage corresponds to a first cassette voltage. If the detected cassette voltage is determined to not correspond to the first cassette voltage, the cassette 10 proceeds to step 530. If the detected cassette voltage is determined to correspond to the first cassette voltage, the cassette 10 proceeds to step 560.

At step 530, the cassette 10 determines whether the detected cassette voltage corresponds to a second cassette voltage. If the detected cassette voltage is determined to not correspond to the second cassette voltage, the cassette 10 proceeds to step 540. If the detected cassette voltage is determined to correspond to the second cassette voltage, the cassette 10 proceeds to step 570.

The cassette 10 further determines whether the detected cassette voltage corresponds to a third cassette voltage to a $(Z-1)^{th}$ cassette voltage. If the detected cassette voltage is determined to not correspond to the third cassette voltage to the $(Z-1)^{th}$ cassette voltage, the cassette 10 proceeds to a step for comparing the next cassette voltage. If the detected cassette voltage is determined to correspond to any one of the third cassette voltage to the $(Z-1)^{th}$ cassette voltage, the cassette 10 determines that it has been mounted on a slot corresponding to a corresponding cassette voltage.

At step 540, the cassette 10 determines whether the detected cassette voltage corresponds to a $Z^{th}$ cassette voltage. If the detected cassette voltage is determined to not correspond to the $Z^{th}$ cassette voltage, the cassette 10 proceeds to step 550. If the detected cassette voltage is determined to correspond to the $Z^{th}$ cassette voltage, the cassette 10 proceeds to step 580.

At step 550, the cassette 10 determines that it has not been properly mounted on a slot. That is, the cassette 10 may determine that it has not been properly mounted on a slot because the detected cassette voltage is determined to not correspond to the first cassette voltage to the $Z^{th}$ cassette voltage.

At step 560, the cassette 10 determines that it has been mounted on a first slot.

At step 570, the cassette 10 determines that it has been mounted on a second slot.

At step 580, the cassette 10 determines that it has been mounted on the $N^{th}$ slot.

Figure 6:
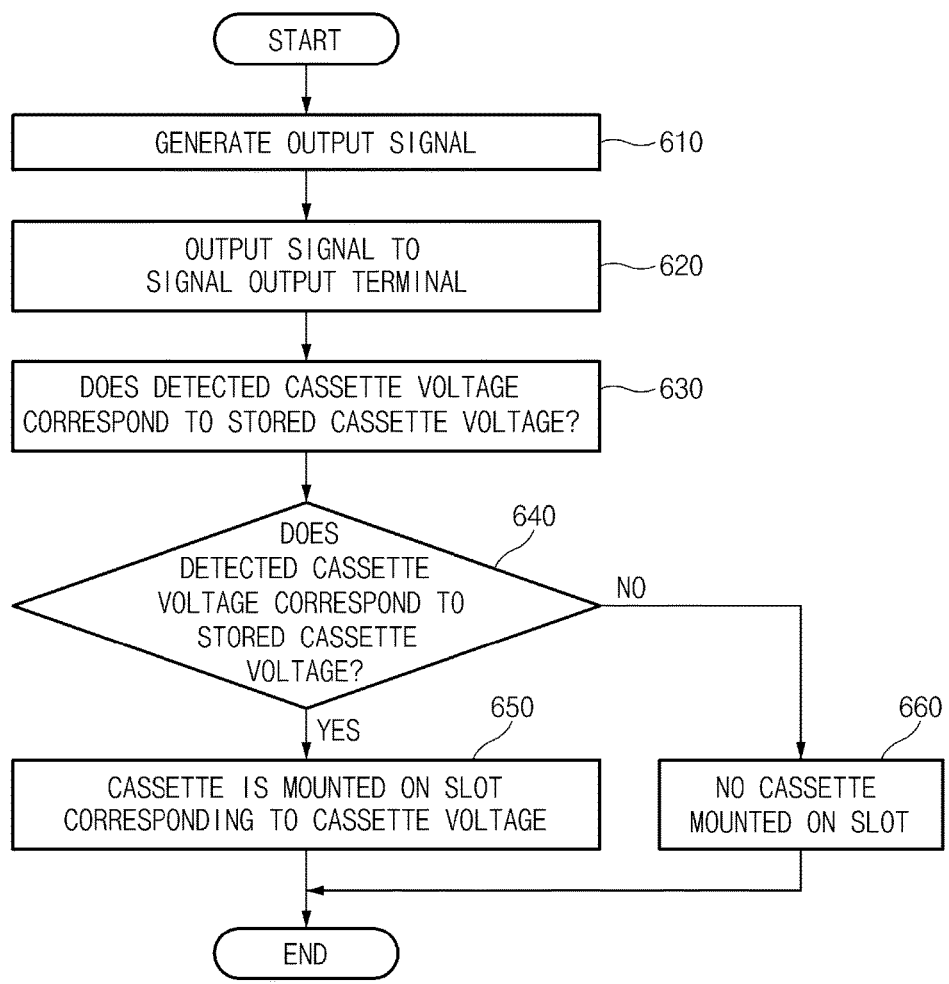
FIG. 6 is a flowchart illustrating a method for detecting the mounting of a cassette in the cassette mounting detection apparatus in accordance with an embodiment of the present invention.

FIG. 6 is a flowchart illustrating a method for detecting the mounting of a cassette in the cassette mounting detection apparatus in accordance with an embodiment of the present invention.

The flowchart illustrated in FIG. 6 includes steps that are processed by the cassette mounting detection apparatus 100 or the financial apparatus 200 illustrated in FIGS. 1 to 4. It may be seen that although contents are omitted below, the contents described above in connection with the cassette mounting detection apparatus 100 or the financial apparatus 200 illustrated in FIGS. 1 to 4 may also be applied to the flowchart illustrated in FIG. 6.

At step 610, the signal generation unit 123 generates an output signal to be output to the cassette mounting unit 110.

At step 620, the signal generation unit 123 sequentially outputs the output signal to a plurality of the signal output terminals 121.

At step 630, the signal detection unit 124 detects the cassette voltages of a plurality of slots through the plurality of voltage detection terminals 122.

At step 640, the mounting detection unit 125 compares each of the detected cassette voltages with stored cassette voltages.

If the detected cassette voltage is determined to correspond to any one of a first cassette voltage to a $Z^{th}$ cassette voltage, the mounting detection unit 125 proceeds to step 650. If the detected cassette voltage is determined to not correspond to any one of the first cassette voltage to the $Z^{th}$ cassette voltage, the mounting detection unit 125 proceeds to step 660.

At step 650, if the detected cassette voltage is determined to correspond to any one of the first cassette voltage to the $Z^{th}$ cassette voltage, the mounting detection unit 125 determines that a cassette has been mounted on a slot corresponding the corresponding cassette voltage.

At step 660, if the detected cassette voltage is determined to not correspond to any one of the first cassette voltage to the $Z^{th}$ cassette voltage, the mounting detection unit 125 determines that there is no cassette mounted on a slot.

As described above, the mounting detection unit 125 may detect that how many cassettes have been mounted on which slots in the cassette mounting unit 110 based on an output signal and a detected cassette voltage.

The mounting detection circuit of each slot may share any one of the signal output terminal 121 and the voltage detection terminal 122 along with the mounting detection circuits of other slots. Accordingly, although the sum of the number of signal lines for outputting an output signal and the number of signal lines for detecting a cassette voltage is smaller than the number of a plurality of slots of the cassette mounting unit, the cassette mounting detection apparatus 100 according to the present embodiment may detect whether a cassette has been mounted.

Figure 7:
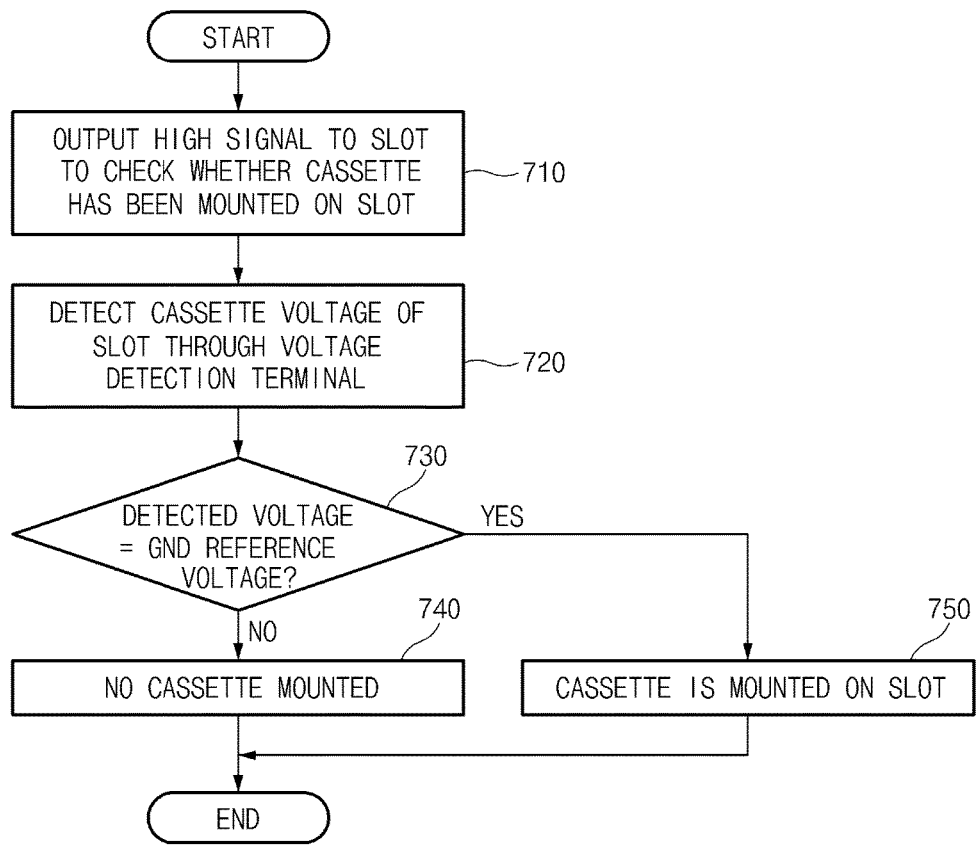
FIG. 7 is a flowchart illustrating a method for detecting the mounting of a cassette in the cassette mounting detection apparatus in accordance with another embodiment of the present invention.

FIG. 7 is a flowchart illustrating a method for detecting the mounting of a cassette in the cassette mounting detection apparatus in accordance with another embodiment of the present invention.

The flowchart illustrated in FIG. 7 includes steps that are processed by the cassette mounting detection apparatus 100 or the financial apparatus 200 illustrated in FIGS. 1 to 4. It may be seen that although contents are omitted below, the contents described above in connection with the cassette mounting detection apparatus 100 or the financial apparatus 200 illustrated in FIGS. 1 to 4 may also be applied to the flowchart illustrated in FIG. 7.

At step 710, the signal generation unit 123 outputs an output signal of a high signal to a slot to be checked regarding whether a cassette has been mounted to the slot.

At step 720, the signal detection unit 124 detects the cassette voltage of the slot through the voltage detection terminal connected to a slot to be checked regarding whether the cassette 10 has been mounted on the slot.

At step 730, the mounting detection unit 125 determines whether the detected cassette voltage corresponds to a specific reference voltage (e.g. a GND reference voltage). If the detected cassette voltage is determined to correspond to the specific reference voltage, the mounting detection unit 125 proceeds to step 740. If the detected cassette voltage is determined to not correspond to the specific reference voltage, the mounting detection unit 125 proceeds to step 750.

At step 740, the mounting detection unit 125 determines that a cassette has not been mounted on the slot.

At step 750, the mounting detection unit 125 determines that a cassette has been mounted on the slot.

As described above, the cassette mounting detection apparatus generates a signal for detecting a slot on which a cassette has been mounted and detects a slot on which a cassette has been mounted based on a cassette voltage detected in response to the signal. Accordingly, the mounting of a cassette can be effectively detected although the number of slots increases.

Furthermore, the number of signal lines/cables for connecting the cassette mounting unit and the main control unit can be reduced by sharing any one of the signal line/cable for receiving a signal generated by the main control unit and the signal line/cable for outputting a signal to the main control unit with other slots.

Although all the elements constituting an embodiment of the present invention are illustrated to be combined into one or to be combined and operated, the present invention is not necessarily limited to the embodiment. That is, one or more of all the elements may be selectively combined and operated within the range of the present invention. Furthermore, each of all the elements may be implemented using independent hardware, but may be implemented as a computer program having a program module for performing some of or all functions combined in one or more pieces of hardware in which some of or all the elements are selectively combined. Codes and code segments constituting the computer program may be readily induced by those skilled in the art to which the present invention pertains. The computer program may be stored in computer-readable media and read and executed by a computer, thereby being capable of implementing the embodiments of the present invention. The storage media of the computer program may include magnetic recording media, optical recording media, carrier wave media, and so on.

Furthermore, the term described above, such as "comprise", "include", or "has", is meant to include a corresponding element unless explicitly described to the contrary and thus should not be construed as excluding other elements, but should be construed as including other elements. All terms used herein, including technical or scientific terms, have the same meanings as those typically understood by those skilled in the art to which the present invention pertains, unless otherwise defined. Terms, such as ones defined in common dictionaries, should be construed as having the same meanings as those in the context of related technology and should not be construed as having ideal or excessively formal meanings unless clearly defined the present invention.

While some exemplary embodiments of the present invention have been described with reference to the accompanying drawings, those skilled in the art may change and modify the present invention in various ways without departing from the essential characteristic of the present invention. Accordingly, the disclosed embodiments should not be construed as limiting the technical spirit of the present invention, but should be construed as illustrating the technical spirit of the present invention. The scope of the technical spirit of the present invention is not restricted by the embodiments, and the scope of the present invention should be interpreted based on the following appended claims. Accordingly, the present invention should be construed as covering all modifications or variations derived from the meaning and scope of the appended claims and their equivalents.

What is claimed is:

1. A cassette mounting detection apparatus, comprising:
   a cassette mounting unit configured to comprise a plurality of slots on which multiple cassettes are respectively mounted, and comprising mounting detection circuits of the respective slots; and
   a main control unit configured to comprise a plurality of signal output terminals and a plurality of voltage detection terminals and to detect whether a cassette of the multiple cassettes is mounted on a corresponding slot of the plurality of slots based on a cassette voltage detected through the voltage detection terminals,
   wherein voltage levels of the cassette voltage vary depending on a combination of the signal output terminal and the voltage detection terminal to which the mounting detection circuit that corresponds to the slot being mounted by the cassette is connected.

2. The cassette mounting detection apparatus of claim 1, wherein the mounting detection circuit of each slot shares one of the signal output terminal or the voltage detection terminal along with the mounting detection circuits of other slots.

3. The cassette mounting detection apparatus of claim 1, wherein the mounting detection circuits of the plurality of slots connected to the same signal output terminal are connected to different voltage detection terminals.

4. The cassette mounting detection apparatus of claim 3,
   wherein a maximum number of the mounting detection circuits of slots capable of being connected to one of the voltage detection terminals is identical with a number of the signal output terminals.

5. The cassette mounting detection apparatus of claim 1, further comprising:
   a cable configured to connect the cassette mounting unit and the main control unit,
   wherein the main control unit comprises m signal output terminals and n voltage detection terminals, and the cassette mounting detection apparatus is capable of detecting a maximum of (m*n) cassettes using (m+n) cables.

6. The cassette mounting detection apparatus of claim 1,
   wherein a single voltage detection terminal is connected to at least one pull-down resistor, and
   wherein the cassette voltage is determined at least based on a resistance value of a pull-down resistor of a voltage detection terminal to which the mounting detection circuit of each slot is connected and a resistance value of an internal resistor of the mounting detection circuit.

7. The cassette mounting detection apparatus of claim 6,
   wherein the resistance values of the pull-down resistor and the internal resistor are determined so that a resistance ratio calculated for each slot has a different value, and
   wherein the resistance ratio is a ratio of the resistance value of the pull-down resistor to a sum of the resistance value of the pull-down resistor and the resistance value of the internal resistor.

8. The cassette mounting detection apparatus of claim 1,
   wherein the mounting detection circuit of each slot comprises an internal resistor and a diode configured to prevent an output signal from flowing into a mounting detection circuit of another slot, and
   wherein the diode is connected to the internal resistor.

9. The cassette mounting detection apparatus of claim 1, wherein the main control unit comprises:
   a signal generation unit configured to generate an output signal and output the output signal to the cassette mounting unit through the signal output terminal;
   a signal detection unit configured to detect the cassette voltage through the voltage detection terminal; and
   a mounting detection unit configured to detect a slot on which a cassette has been mounted based on the detected cassette voltage, wherein the signal generation unit outputs one of a high signal and a low signal as the output signal depending on the signal output terminal.

10. The cassette mounting detection apparatus of claim 9, wherein the signal generation unit outputs the high signal to the mounting detection circuit of a slot to be checked regarding whether a cassette has been mounted on the slot, and wherein the mounting detection unit determines whether the cassette voltage of the slot to which the high signal has been output corresponds to a predetermined reference voltage and determines that a cassette has not been mounted on the slot if the cassette voltage is determined to correspond to the predetermined reference voltage and determines that a cassette has been mounted on the slot if the cassette voltage is determined to not correspond to the predetermined reference voltage.

11. The cassette mounting detection apparatus of claim 9, wherein the signal generation unit sequentially outputs the high signal to the plurality of signal output terminals, and wherein the mounting detection unit detects the slot on which the cassette has been mounted based on the detected cassette voltage.

12. The cassette mounting detection apparatus of claim 1, wherein the main control unit comprises:

a storage unit configured to store a cassette voltage corresponding to each slot; and a mounting detection unit configured to compare a cassette voltage detected in response to the output signal with the cassette voltages stored in the storage unit and determine a slot on which a cassette has been mounted.

13. The cassette mounting detection apparatus of claim 12, wherein the mounting detection unit determines that a cassette has not been mounted on a corresponding slot if a cassette voltage of the slot is a preset value or less.

14. The cassette mounting detection apparatus of claim 1, wherein the cassette detects a cassette voltage of a slot on which the cassette has been mounted and checks that the cassette has been mounted on which slot of among the plurality of slots of the cassette mounting unit based on the detected cassette voltage.

15. A method for detecting a mounting of a cassette, comprising:

generating an output signal;

outputting the output signal to at least one slot on which a cassette is mounted through at least one signal output terminal;

detecting a cassette voltage of a voltage detection terminal connected to the at least one slot through a cable;

comparing the detected cassette voltage with a preset cassette voltage; and detecting a slot on which the cassette has been mounted of among a plurality of slots based on a result of the comparison;

wherein voltage levels of the cassette voltage vary depending on a combination of the signal output terminal and the voltage detection terminal to which the mounting detection circuit corresponding to the slot on which the cassette is mounted on is connected.

16. The method of claim 15, further comprising:

determining that the cassette has been mounted on the slot on which a preset cassette voltage corresponding to the detected cassette voltage is set if the detected cassette voltage corresponds to at least one preset cassette voltage.

17. The method of claim 15, wherein the outputting the output signal includes outputting a high signal to a signal output terminal connected to a slot to be checked regarding whether a cassette has been mounted on the slot.

18. The method of claim 17, further comprising:

determining that a cassette has not been mounted on the slot if a cassette voltage of the voltage detection terminal connected to the slot corresponds to a predetermined reference voltage.

* * * * *